US009921083B2

(12) United States Patent
Lourme et al.

(10) Patent No.: US 9,921,083 B2
(45) Date of Patent: Mar. 20, 2018

(54) DEVICE FOR LOCATING ONE OR MORE MOBILE ELEMENTS IN A PREDETERMINED ZONE, AND METHOD IMPLEMENTED IN SUCH A DEVICE (71) Applicants: VALOTEC, Villejuif (FR); ASSOCIATION INSTITUT DE MYOLOGIE, Paris (FR)

(72) Inventors: Jean-Christophe Lourme, Montreuil (FR); Gary Tendon, Chatillon (FR); Jean-Yves Hogrel, Montrouge (FR)

(73) Assignees: VALOTEC, Villejuif (FR); ASSOCIATION INSTITUT DE MYOLOGIE, Paris (FR)

(*) Notice: Subject to any disclaimer, the term of this patent is extended or adjusted under 35 U.S.C. 154(b) by 0 days.

(21) Appl. No.: 14/910,361

(22) PCT Filed: Aug. 6, 2014

(86) PCT No.: PCT/EP2014/066941
§ 371 (c)(1),
(2) Date: Feb. 5, 2016

(87) PCT Pub. No.: WO2015/018876
PCT Pub. Date: Feb. 12, 2015

(65) Prior Publication Data
US 2016/0195410 A1 Jul. 7, 2016

(30) Foreign Application Priority Data
Aug. 6, 2013 (FR) ..................... 13 57829

(51) Int. Cl.
G01B 7/14 (2006.01)
G01B 7/30 (2006.01)
H01F 5/00 (2006.01)
G01D 5/20 (2006.01)
(Continued)

(52) U.S. Cl.
CPC ............ *G01D 5/2013* (2013.01); *G01B 7/00* (2013.01); *G01B 7/14* (2013.01); *G01B 7/30* (2013.01);
(Continued)

(58) Field of Classification Search
CPC . G01B 7/003; G01B 7/00; G01B 7/14; G01B 7/30; G01D 5/2046; G01D 5/2053;
(Continued)

(56) References Cited

U.S. PATENT DOCUMENTS 5,136,125 A 8/1992 Russell
5,853,327 A 12/1998 Gilboa
(Continued)

OTHER PUBLICATIONS

Written Opinion for French Patent Application No. 1357829, dated Aug. 6, 2013.
French Search Report for French Patent Application No. 1357829, dated Jun. 10, 2014.
International Search Report from International Patent Application No. PCT/EP2014/066941, dated Nov. 18, 2014.

*Primary Examiner* — Huy Q Phan
*Assistant Examiner* — Raul Rios Russo
(74) *Attorney, Agent, or Firm* — Greer, Burns & Crain, Ltd.

(57) ABSTRACT

A method for locating a mobile element in a predetermined zone, including supplying power to an on-board module in the mobile element, where the on-board module includes an electronic circuit and an on-board coil, generating a locating signal by the electronic circuit and transmission of the locating signal via the on-board coil, picking up the locating signal by receiver coils on a support in proximity to the predetermined zone, each of the receiver coils configured to pick up the locating signal when the mobile element is in proximity, and determining a location of the mobile element in the predetermined zone by detecting a signal level on the support in the form of an array by a processing unit connected to the support. The electronic circuit and the on-board coil constitute an RLC circuit that oscillates, generating the locating signal by sudden interruption of the current through the on-board coil.

14 Claims, 6 Drawing Sheets (51) Int. Cl.
- *G01B 7/00* (2006.01)
- *G01S 13/75* (2006.01)
- *G06F 3/046* (2006.01)
- *G01R 33/02* (2006.01)

(52) U.S. Cl.
CPC .......... *G01S 13/751* (2013.01); *G01S 13/758* (2013.01); *G06F 3/046* (2013.01); *G01R 33/02* (2013.01)

(58) Field of Classification Search
CPC ...... G01D 5/142; G01D 5/145; G01D 5/2033; G01D 5/2241; E21B 47/02216; G01S 13/88; G01V 3/00; G01V 3/08; G01V 3/15; G01V 3/165; G06K 7/10158; G01R 33/02
USPC ..... 324/51, 55, 200, 207.11, 207.13, 207.15, 324/207.16, 207.17
See application file for complete search history.

(56) References Cited

U.S. PATENT DOCUMENTS

| | | |
|---|---|---|
| 2001/0035815 A1 | 11/2001 | Fletcher et al. |
| 2004/0125312 A1 | 7/2004 | You et al. |
| 2004/0132461 A1* | 7/2004 | Duncan ................. G01C 21/00 455/456.1 |
| 2008/0186018 A1 | 8/2008 | Anderson |
| 2010/0073177 A1* | 3/2010 | Azancot ................. H02J 5/005 340/657 |
| 2010/0231163 A1* | 9/2010 | Mashinsky ........... B60L 11/182 320/108 |
| 2015/0028807 A1* | 1/2015 | Mashinsky ........... B60L 11/182 320/108 |
| 2015/0116091 A1* | 4/2015 | Lefevre ............. G06K 19/0723 340/10.3 |

* cited by examiner

DEVICE FOR LOCATING ONE OR MORE MOBILE ELEMENTS IN A PREDETERMINED ZONE, AND METHOD IMPLEMENTED IN SUCH A DEVICE

BACKGROUND

The present invention relates to a device and a method for locating one or more mobile elements in a predetermined zone. A particularly useful application is measurement of the activity of several animals (rodents, etc.) in a cage. However, the present invention has a wider scope, as it can be applied in various fields. There may be mentioned in particular:

- Locating parts of the human body, for example the fingers of a hand for producing a sculpture, modelling of shapes with the fingers, man-machine interface for computer applications, etc.,
- Locating objects with respect to a surface (pieces for a board game, etc.),
- Interfaces of graphics tablets, control devices, etc.
- etc.

Generally, in the area of animal experiments, it is sometimes necessary to measure the movements of several animals (rodents, etc.) in a cage. These animals may be mice, rats or others. Such rodents are placed in a cage connected to a device for measuring their movements. Such a device is intended for example to assess the treatment of diseases and to monitor motor performance. This device may be produced within the optical field, the mechanical field or the electrical field.

In the optical field, it is possible to use infrared or any camera in the visible region for monitoring the movement of each mouse. However, this has many drawbacks, such as the difficulty of correctly identifying more than two rodents, or the overall dimensions of the device, as the rodents must be "visible", etc.

In the mechanical field, it is possible to use the dynamic weighing technique. The drawbacks are measurement of activity limited to a single rodent, and an excessive likelihood of interference from objects in the cage (sawdust, excrement, etc.). It is also possible to use the acoustic pulse recognition technique, although this has the drawbacks of inability to identify the rodents and incompatibility with the presence of sawdust.

In the electrical field, the most promising technique is certainly radiofrequency. For example, document U.S. Pat. No. 5,853,327, describing a games platform for locating pieces that can be moved on the platform, is known in the games field. Each piece comprises a coil and a transponder for transmitting a unique identifier in response to excitation originating from a coil placed in the platform. This platform comprises an array of excitation coils. The response originating from the piece is picked up by a winding arranged in the platform, separate from the excitation coils. The piece is supplied from a built-in battery, or from the excitation signal, in which case the piece comprises a resonance capacitor connected to the coil incorporated in the piece. The drawback of such a system is complex addressing of the excitation coils, which are excited one by one.

SUMMARY

A subject of the present invention is to overcome the aforementioned drawbacks, by proposing a device for locating mobile elements using a magnetic field.

Another subject of the invention is to propose a device for identifying mobile elements very efficiently.

Another subject of the invention is to propose a device for locating mobile elements that is compact and can be utilized in an environment that has obstacles, such as a cage for mice.

At least one of the aforementioned objectives is achieved with a device for locating at least one mobile element in a predetermined zone, said device comprising:

- at least one on-board module in the mobile element, this on-board module comprising an electronic circuit and at least one on-board coil for transmitting a locating signal,
- a power supply for this on-board module,
- receiver coils distributed on a support in proximity to the predetermined zone.

According to the invention, each receiver coil has the function of detecting said locating signal when the mobile element is in proximity; this device further comprising:

- a processing unit connected to the receiver coils for determining, for example in real time or with a time delay, the location of the mobile element in the predetermined zone by detecting a signal level or by combinations of signals on said support which is addressed in rows and columns in the form of an array.

Reading can be carried out by row and column of an array, which is not necessarily orthonormal. The distribution of the coils is not necessarily uniform; there may be zones of high density (several coils) and zones of low density. The invention allows one or more mobile elements to be located. The receiver coils may also not be connected together and may be read independently.

By "proximity" is meant a sufficient distance for the coils to interact via a magnetic field. A person skilled in the art can determine this distance by experiment and/or as a function of the magnetic characteristics of each component involved.

According to one embodiment example, the rows and the columns of the array are independent and each row and each column is constituted by several receiver coils connected in series.

With the device according to the invention, the accuracy is in particular a function of the number of rows and columns of the array of receiver coils and of the size of each receiver coil. The processing unit makes it possible to read, in particular sequentially or simultaneously, all the rows and columns so as to identify those that have picked up a portion of the locating signal. One of the simplest solutions consists of then looking for a maximum among all the rows and all the columns that have picked up a signal so as to deduce therefrom the precise location of each mobile element. The location of each mobile element may then be displayed on a screen. Certain parameters of the locating device (accuracy, temporal resolution, etc.) may be improved for example by calculation methods such as barycentre calculation, interpolation by cubic splines, storing the previous position of the on-board modules for selecting the antennas to be read in the next locating cycle, etc. Calculation of the barycentre consists of calculating the barycentre of a group of coils that preferably have picked up a locating signal. It is not the maximum that is detected, but the barycentre of a group constituting a given zone.

According to the invention, row information and column information may be recovered. It is the digital processing of the processing unit that can make it possible to determine the coordinate corresponding to the intersection of the row of greatest intensity with the column of greatest intensity, this method being a first method; others that are more complex, mentioned above, may be utilized. This makes it possible to simplify the design of the array of receiver coils compared with the arrays of the prior art.

According to an advantageous feature of the invention, the power supply may comprise an on-board battery in each mobile element. In this case, a rechargeable or non-rechargeable battery is inserted in or placed on the mobile element and supplies energy to the electronic circuit.

According to a variant of the invention, it may be envisaged that the power supply comprises a magnetic winding arranged in proximity to the predetermined zone so as to supply each on-board module remotely, by magnetic field. In this case, the power supply is carried out remotely, by magnetic field. The advantage is that the service life of the on-board module is thus increased as it does not contain a battery and is supplied remotely, the on-board coil for example being used advantageously for receiving magnetic energy. This energy may be stored in a capacitor for later use. The winding may be flat with a diameter allowing the whole of the predetermined zone to be irradiated.

According to another variant of the invention, the power supply may be generated by the array of receiver coils so as to supply each on-board module remotely, by magnetic field. The array of receiver coils comprises a first function of receiving the locating signal and a second function of power supply. Preferably, these two functions are performed successively. This makes it possible to save space compared with a power supply by an independent additional winding, but makes management of supply and detection more complicated.

In the case of remote power supply by magnetic field, the on-board module preferably comprises a supply coil having the function of picking up the remote power supply magnetic field. This power supply coil and the on-board coil can constitute the same coil.

Depending on the application (locating, physiological measurements, etc.), the on-board module may contain a microcontroller, an ASIC or even a simple analogue or digital circuit.

With such an electronic circuit, the on-board module is equipped with an intelligence that can provide effective management of the generation of the locating signal. The on-board module may be parameterized according to the type and frequency of transmission of the desired locating signal.

In the case where a single coil is used in the on-board module, this coil makes it possible to pick up the magnetic field when it is a matter of remote power supply and transmit the locating signal to the receiver coils. In order to maintain good sensitivity regardless of the orientation of the on-board coil, it may be envisaged that the on-board module comprises for example two, or several on-board coils. In the case when three coils are used, these three coils may be arranged as a trihedron and may be arranged to replace or supplement said on-board coil. All the functions or some of the functions dedicated to the on-board coil may be entrusted to these three coils in a trihedral arrangement. In this way, whatever the path of the mobile element in the predetermined zone, its location may be defined precisely and accurately.

According to an advantageous feature of the invention, each on-board coil may comprise a ferrite core. This ferrite core may comprise ends of suitable shape (hemisphere, etc.) so as to channel and increase the magnetic field flux passing through the on-board coil or the coils in a trihedral arrangement.

According to one embodiment of the invention, the array of receiver coils can comprise two electrically independent sub-arrays each comprising several rows of receiver coils, these two sub-arrays being superimposed and perpendicular so as to form rows and columns, locating being carried out by identifying, in each sub-array, the nearest row of an on-board coil transmitting a locating signal or by a combination of the signals received by one or more rows of coils. In such an arrangement, the rows and the columns are on two different parallel planes. It can in particular be envisaged to have the rows and/or the columns of the coils on several planes so as to improve the resolution of the array.

As a non-limitative example, the array of receiver coils can be constituted by flat coils etched on a printed circuit or by any conductor on an insulating surface. The dimensions of each coil can be 5 mm×5 mm.

According to another aspect of the invention, a method is proposed for locating at least one mobile element in a predetermined zone, this method comprising the following steps:

supplying power to at least one on-board module in the mobile element, this on-board module comprising an electronic circuit and at least one on-board coil, generating a locating signal by the electronic circuit and transmission of this locating signal via the on-board coil, picking up the locating signal by means of receiver coils distributed on a support in proximity to the predetermined zone; each coil having the function of picking up said locating signal when the mobile element is in proximity, determining, in real time or with a time delay, the location of the mobile element in the predetermined zone by detecting a signal level on said support, which is addressed in rows and columns in the form of an array by means of a processing unit connected to this support. It is possible to use a combination of the signals received by one or more arrays of coils for determining the location of the mobile element.

For efficient control of power consumption, supply that is carried out periodically can be provided; in the supply phase, energy is stored in each on-board module for later use in the non-supply phase. Typically, energy storage means, such as a capacitor, are supplied during the supply phase, then the supply is cut off and the locating signal is generated, so as to determine the location of the mobile element.

Advantageously, a locating signal can be generated at a different time for each on-board module so as to carry out multiplexing with time-distributed multiple access (TDMA) in order to distinguish the on-board modules from one another. The locating signal can be in the form of a pulse, which will be picked up by the array of receiver coils. In this embodiment, a synchronizing signal can be provided, which can be the end of the supply phase or any other synchronizing signal transmitted for example by a supply winding or by the array of receiver coils. Based on this synchronizing signal, each on-board module can comprise a counter that allows the locating signal to be transmitted at a predetermined time, which is different for each on-board module. Thus, on reception, the processing unit can easily associate each locating signal with the on-board module from which it originates. For this, it is sufficient for example to measure the length of time between the synchronizing signal and reception of the locating signal.

According to another embodiment, a locating signal is produced by generating a signal of a predetermined frequency, which is different for each on-board module, so as to carry out multiplexing with frequency-distributed multiple access (FDMA) in order to distinguish the on-board modules from one another. The on-board modules can each transmit a locating signal of the frequency type at the same time. These frequency signals can be picked up almost at the same time by the array of receiver coils. In this embodiment, on reception, the processing unit is configured in order to identify the frequency of each locating signal; each frequency allows the corresponding on-board module to be identified. It is also possible to envisage a combination of the two embodiments thus described. In fact, the on-board modules can transmit locating signals in the form of frequency signals at different times.

According to an advantageous embodiment, each locating signal can contain a unique identifier. It is in fact a question of encoding the locating signal for simplifying the correspondence between the locating signal and the corresponding on-board module.

The electronic circuit and the on-board coil can constitute an RLC circuit, which oscillates, generating the locating signal. The oscillation can even be highly damped. In particular, in addition to the foregoing, in order to create an overvoltage in the locating signal and thus make it more easily detectable, the current through the on-board coil is interrupted suddenly so as to generate a locating signal. It is a sudden change in the current through the coil, preferably when the current is at its highest value. In particular a discontinuity is created, inducing a relatively high overvoltage, which the array of receiver coils will be able to pick up efficiently.

BRIEF DISCRIPTION OF THE DRAWINGS

Other advantages and characteristics of the invention will become apparent on examination of the detailed description of an embodiment which is in no way limitative, and the attached diagrams, in which.

DETAILED DESCRIPTION

The present invention can be applied advantageously to many fields. Hereinafter, only two embodiments will be described; other embodiments can easily be envisaged or deduced from the present description.

A first embodiment will describe application of the device according to the invention in the field of displays for producing an interactive 3D screen.

A second embodiment will describe a device for measuring the activity of several animals, in particular several mice in a cage. The present invention can quite obviously be applied in the same way for animals other than mice.

Figure 1:
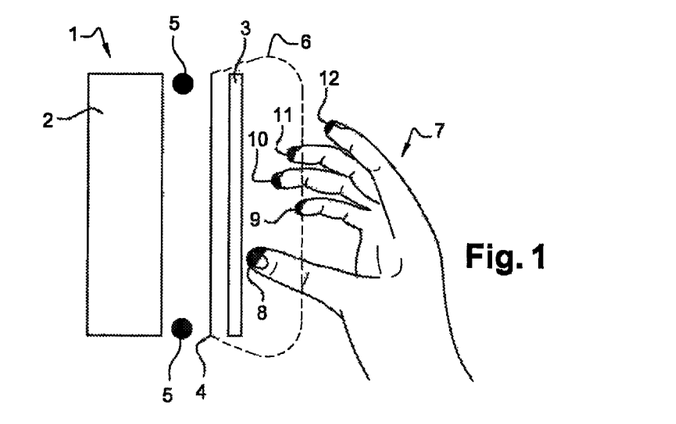
FIG. 1 is a diagrammatic view of a hand moving in front of a television screen, a telephone screen or other, according to the device according to the invention.

In order to illustrate the first embodiment, FIG. 1 shows a very simplified diagram illustrating a screen 1, in particular a touch screen. This screen is said to be 3D interactive as it can receive instructions from a hand 7 positioned at a distance from the screen. Such a screen 1 comprises a rear panel 2 comprising hardware and software means, in particular a processing unit for data processing and display. A front panel 3, preferably of transparent glass, is arranged in front of the screen 1. This panel also serves to protect the internal components of the screen. According to the invention, an array of receiver coils 4 and a supply winding 5 are inserted between the rear panel 2 and the front panel 3. The winding 5 can be located on the inside as shown in FIG. 1 or on the outside. Other forms and means of power supply can be envisaged. This supply winding 5 has the purpose of supplying the on-board modifies 8-12, arranged on fingers of the hand 7, remotely by magnetic field. The fingers can be regarded as mobile elements. Each on-board module 8, . . . , 12 comprises intelligence, allowing it to transmit a locating signal that is intended to be picked up by the array of receiver coils 4. The latter is designed so that after processing by a processing unit, the location of each on-board module can be determined. Actions can be generated as a function of the position of each end of the finger where an on-board module is located. By extension, the movements of one or more on-board modules can be monitored perfectly so as to identify gestures, used as commands. These gestures are first interpreted by the processing unit, before commands are deduced from them.

In the example in FIG. 1, the array of receiver coils is sandwiched between the power supply 5 and the front panel 3. Other arrangements can be envisaged, provided that the power supply can suitably supply the on-board modules 8 to 12 and the array of receiver coils can receive locating signals transmitted by the on-board modules. The power supply 5 can be sandwiched between the array 4 and the front panel 3.

In FIG. 1, reference 6 denotes a predetermined zone, i.e. a volume in which the on-board modules are detectable. This predetermined zone 6 is defined by the physical characteristics of the receiver coils arranged in the array 4. The predetermined zone 6 represents the zone of influence of these receiver coils. The power supply 5 must also be suitably dimensioned in order to supply the on-board modules that are located in the predefined zone.

In practice, the on-board modules can be incorporated in gloves worn by a user 7. These on-board modules can also be electronic devices designed to be held at the end of the fingers of the user 7.

The diagram in FIG. 1 is not to scale. The screen 1 can be a computer screen, a television, a portable telephone, a "smart phone" or any other display device or more simply an input device with or without contact (without display) connected to a processing unit.

An embodiment will now be described, utilizing a device according to the invention making it possible to measure the movements of several mice in a cage for example of the Eurostandard Type II type (267×207×140 mm).

This device is intended to evaluate the treatment of diseases and for monitoring motor performance. This priority area of research is justified by the need to improve the quantitative monitoring of clinical trials in particular in the context of the evaluation of pharmacological, gene or cell therapies.

Figure 2:
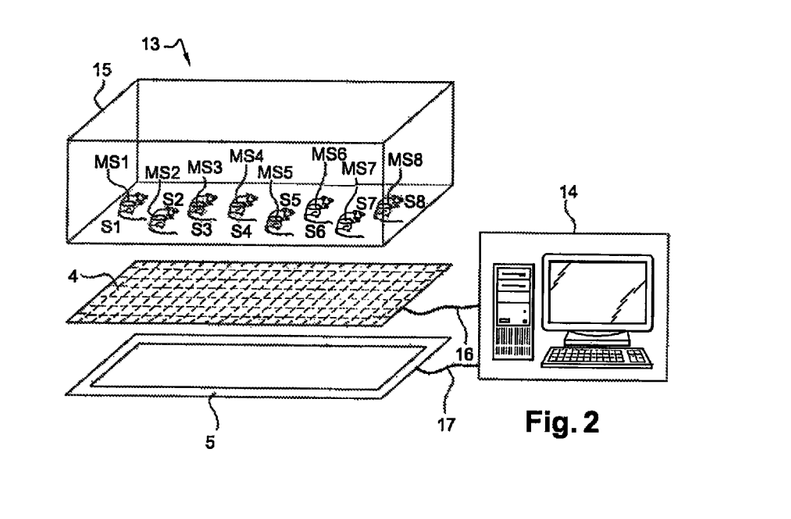
FIG. 2 is a diagrammatic view of a device for measuring the activity of a mouse according to the present invention.

FIG. 2 shows such a measuring device, with the general reference 13, connected to a computer 14. The latter can comprise a processing unit provided with suitable hardware and software means that are known per se in particular for communicating with the measuring device 13. The processing unit can comprise a microprocessor mounted on a motherboard, random-access memory, a power supply, a hard disk, conventional input means and expansion boards connected to the measuring device 13. Software means can be developed for controlling the measuring device 13 and processing the data originating from this measuring device 13 so as to display the progress of the mice on a display screen.

The microprocessor in particular makes it possible to implement the steps of the method according to the invention.

The measuring device 13 according to the invention makes it possible to locate in real time for example eight mice S1 to S8 on an area of 267 mm×207 mm, which corresponds to the bottom of a Eurostandard Type II cage 15. The mice can move freely in this cage 15.

An on-board module MS1 to MS8 is implanted in each mouse S1 to S8 respectively and regularly transmits an electromagnetic signal allowing it to be located by the array of receiver coils 4. This array can operate on the same principle as the array described in FIG. 1, although it may differ from the latter in physical and geometrical characteristics. The array of receiver coils 4 is arranged under the cage 15 and has substantially the same dimensions as the bottom of the cage 15. In the present case, the array 4 is flat, rectangular and positioned parallel to the bottom of the cage 15.

The on-board modules MS1 to MS8 do not have a battery. They are supplied remotely (remote power supply) by the winding 5, which is arranged under the array of receiver coils 4. However, other arrangements can be envisaged, for example above the cage 15. For reasons of space, the array of receiver coils 4 and the winding 5 can be placed integral with one another in a case (not shown), the whole constituting a support capable of receiving the cage 15. The cage 15 can be placed so that it can be removed. Different cages can thus be used on one and the same support.

The measuring device 13 operates with a connection to the computer 14, on which the position of the mice to be located is displayed in real time and is recorded. An expansion board can be provided in the computer 14 for supplying and exchanging data with the array of receiver coils 4 via a wired 16 or wireless link. An expansion board can also be provided in the computer 14 in order to control the power supply of the winding 5 via a link 17.

The spatial accuracy of location is 5 mm and the time resolution is 1 second. The accuracy of location depends on the geometry of the receiver coils that serve as receiving antennas.

The array of receiver coils 4 and the winding 5 can be arranged in a cabinet with other components allowing the signals to be relayed between the measuring device 13 and the computer 14. The dimensions of the measuring device are such that these measuring devices can be used in racks of cages for mice.

With this measuring device, the winding 5 remotely supplies the on-board modules MS1 to MS8, which in turn generate and transmit locating signals, which are picked up by the array of receiver coils 4. The latter is designed so as to be able to determine the location of each on-board module. For this purpose, a computer 14 is used in order to control the measuring device and to method the data originating from the array of receiver coils. The movement of each mouse in real time can thus be monitored.

Figure 3:
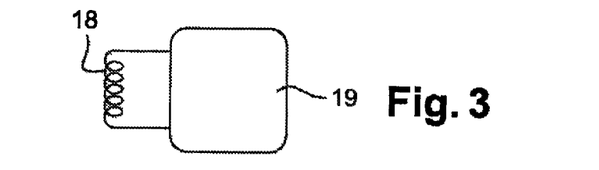
FIG. 3 is a simplified electronic circuit diagram of an on-board coil connected to an electronic circuit for generating the locating signal.

In addition to the foregoing, FIG. 3 shows a diagram illustrating an on-board module MS1, . . . , MS8. Each on-board module comprises an on-board coil 18 and an electronic circuit 19. The latter is provided with electronic components and a microcontroller making it possible to generate a locating signal at predetermined times, regularly or irregularly.

More precisely, the remote power supply of the on-board modules is carried out by inductive coupling between the on-board coil 18 and the winding 5. The winding 5 is a coil placed in proximity to the cage 15, and transmits a magnetic field in the entire detection zone, so as to supply the on-board modules regardless of their positions and their orientations in the cage.

This variable magnetic field induces voltages at the terminals of the on-board coils inside the on-board modules and serves to supply the electronic circuits 19.

Figure 4:
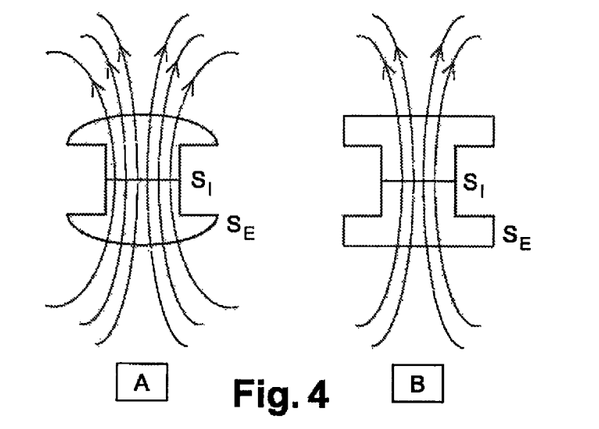
FIG. 4 is a diagrammatic view of three ferrite cores that can be incorporated in an on-board coil so as to improve its performance.

Advantageously, ferrite cores can be used in the on-board coils 18 to increase the performance of remote power supply. The geometry of the ferrite cores may allow the system to be made less sensitive to the orientation of the on-board modules. Thus, a ferrite core with "hemispherical" ends as shown in A in FIG. 4 makes it possible to channel a portion of the magnetic field transmitted by the remote supply winding 5, even when the axis of the ferrite core is orthogonal to the axis of the winding 5 transmitting the remote power supply field.

Figure 5:
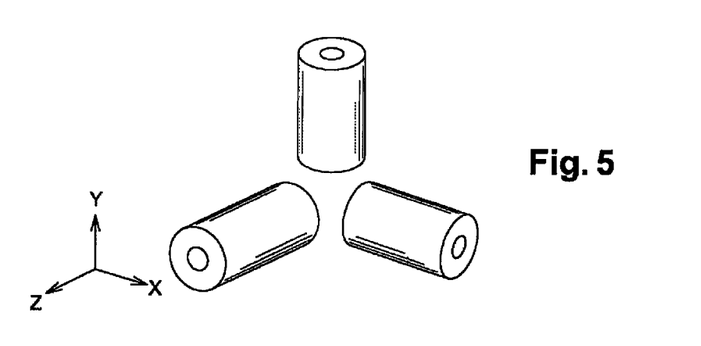
FIGS. 5 and 6 are diagrammatic views of on-board coils in a trihedral arrangement in order to improve coupling with a device for remote power supply and location, in particular three-dimensional.

Generally, during use, it is possible that the on-board coil that is intended to transmit the locating signal is not effectively oriented. This can in particular occur when its axis does not allow coupling with the array of receiver coils. In this case, the locating signal received is too weak to be exploited for locating the on-board module. One of the solutions for correcting this state is for example to use several transmitting coils oriented differently in each on-board module. The diagram in FIG. 5 shows such a topology of coils transmitting the locating signal in a trihedral arrangement. In fact, three coils are used instead of just one.

These three coils are arranged on three orthogonal axes and transmit one and the same locating signal. Other configurations can be envisaged. Thus, regardless of the orientation of the on-board module with respect to the array, the receiving antennas always receive one or more signals of a high enough level originating from the on-board module.

Exploiting the locating signals transmitted by one or more transmitting coils can also be envisaged in order to ascertain the orientation (rotation about the X, Y and Z axes) and even the direction (by combining several transmitting modules or using several transmitting coils) of the on-board module, in addition to the position.

In general, multiplying the orientations of the transmitting and receiver coils can be envisaged for example in order to improve the locating and remote power supply of the on-board modules.

In addition to these geometrical arrangements of the transmitting coils allowing optimization of location, optimization of the use of these various coils can be envisaged. For example, depending on the spatial position of a given transmitter, the transmitting coil or coils with the best geometrical arrangement of this transmitter in a given plane for locating could be used more than the other transmitting coils of the same on-board module. This principle can also be implemented for remote power supply of the on-board modules if the latter are for example supplied by means of a magnetic field transmitted by the array of receiver coils.

The coils in FIG. 5 are elongated coils comprising a ferrite core. The shape of these coils is an elongated cylinder, the height along the axis of revolution being greater than the diameter of the cylinder.

Figure 6:
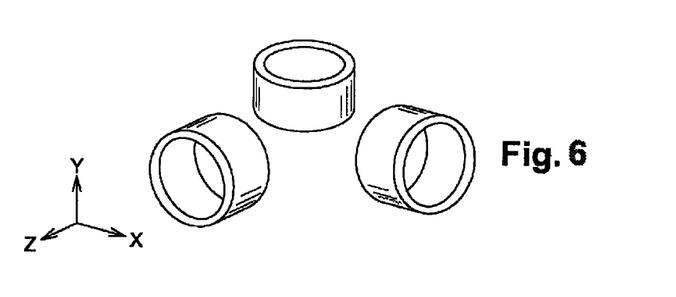

FIG. 6 shows another example of the shape of coils shown in FIG. 5. It is a flat cylinder having a height that is less than the diameter of the cylinder.

Figure 7:
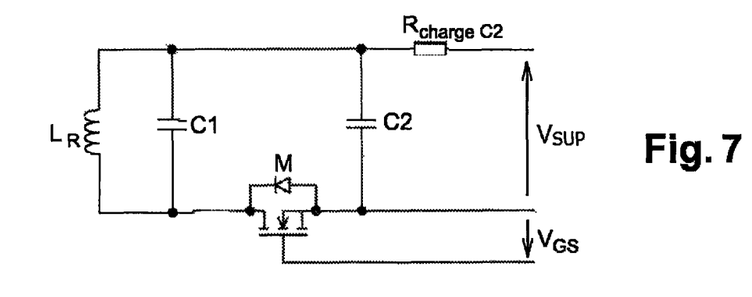
FIG. 7 is a simplified internal electronic circuit diagram of the electronic circuit connected to the on-board coil.

The energy received by the on-board coils makes it possible to supply the electronic circuit of each on-board module so as to generate pulses by causing a sudden change in the current through the coil LR as shown in FIG. 7. The coil LR can be the same as the coil used for receiving the energy. FIG. 7 shows a simplified electronic circuit diagram in which LR and C1 are arranged in parallel. A second capacitor of greater capacitance C2 is connected to one end of C1. A switch M, which can be a MOSFET transistor, is arranged between the other ends of C1 and of C2.

The supply voltage $V_{SUP}$ of the on-board module is used for charging the capacitor C2 via a charging resistor $R_{charge\ C2}$.

In order to generate the locating signal, which is advantageously a magnetic field, circulation of an electric current that varies over time through the coil LR comprising one or more turns is envisaged. Two methods for generating a signal allowing locating are resonance/oscillation of the capacitor C1 and coil LR and sudden change in the current through the coil LR. Generally the locating signal can be created as follows:

it is possible to discharge one or more voltage-charged capacitors into one or more coils,
it is possible to create a sudden variation in the currents passing through one or more coils.

Figure 8:
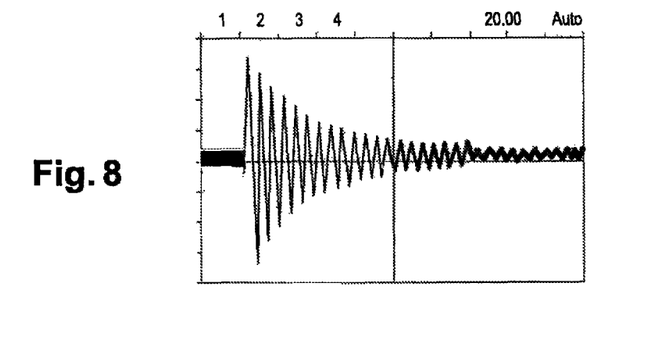
FIG. 8 is a curve representing a locating signal transmitted by the on-board module, this signal being in the form of a damped oscillating signal.
Figure 9:
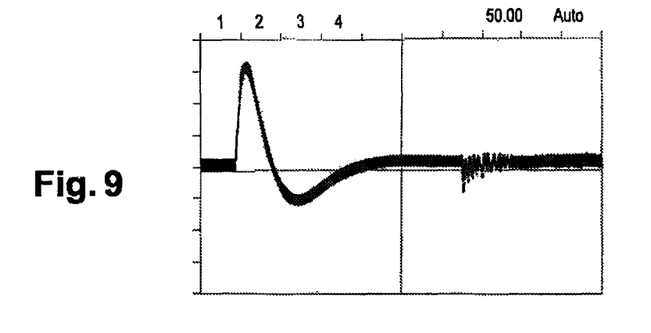
FIG. 9 is a curve representing a locating signal transmitted by the on-board module, this signal being in the form of a highly damped oscillating signal.
Figure 10:
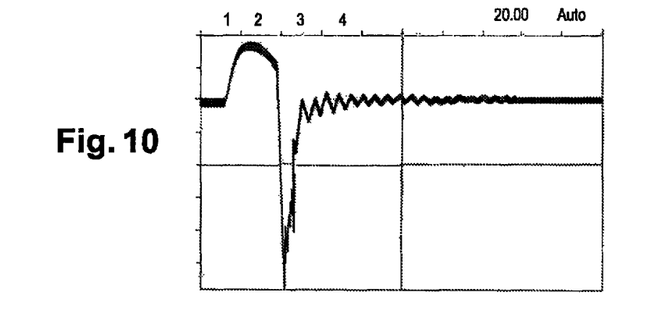
FIG. 10 is a curve representing a locating signal transmitted by the on-board module, this signal being in the form of a pulse that comprises a notable overvoltage that can be detected.

FIGS. 8 to 10 show three curves representing three solutions for a locating signal generated by the on-board module.

Solution 1: the principle is to discharge a capacitor into a coil in a slightly damped pseudo-oscillating mode. FIG. 8 is a curve representing the variation of the voltage induced in the array of receiver coils.

Solution 2: the principle is to discharge a capacitor into a coil in a highly damped pseudo-oscillating mode. FIG. 9 is a curve representing the variation of the voltage induced in the array of receiver coils.

This second solution makes it possible to generate a pulse in the array of receiver coils that is of longer duration and has a greater amplitude than that of solution No. 1.

Solution 3: the principle is, to significantly increase the voltage induced in the array of receiver coils by causing a rapid variation in the current in an inductor. For this purpose, a current is circulated through an inductor and this electric current is varied suddenly. This sudden variation in the current causes a sudden variation in the flux of the magnetic field generated by the inductor. A rapid variation in the magnetic flux transmitted by an on-board module leads to a high induced voltage in the array of receiver coils, since the voltages induced at the terminals of the receiver coils increase with the variation in the magnetic flux passing through them. FIG. 10 is a curve representing the profile of the voltage induced in the array of receiver coils.

The induced voltage generated is higher than in the two preceding solutions under similar conditions.

A system for forcing the sudden variation in the current passing through the inductor transmitting the locating signal when the latter reaches its maximum can be envisioned. Thus, the voltage created at the terminals of the receiving antennas will be maximum. This search for the maximum can be carried out for example by calculation, by detection of the maximum current or by other means.

Figure 11:
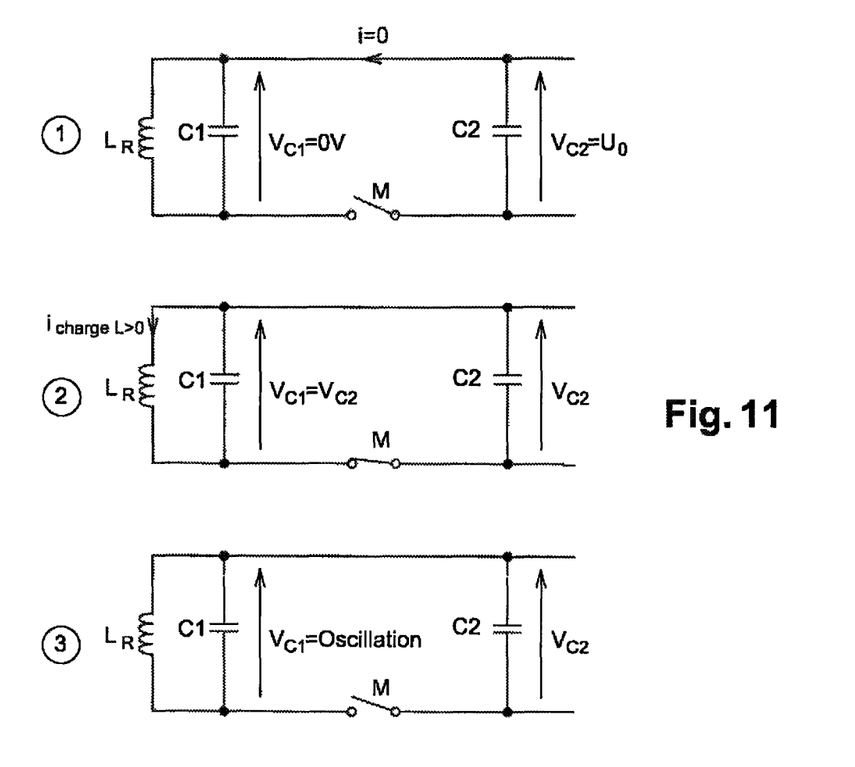
FIG. 11 is a diagrammatic view illustrating the procedure for generating a pulse according to the invention.

As an example, the illustrations in FIG. 11 describe an embodiment of the electronic circuit for generating a locating signal, which is advantageously a pulse as described in the third solution. FIG. 11 is a more simplified representation of the electronic components already shown in FIG. 7.

The inductor LR and the capacitor C1 are in parallel. C2 is a high-value capacitor initially charged to U0 and M is the controllable switch constructed for example with a transistor or other means. The steps for generating the locating signal can be as follows.

In a first phase, energy is stored in the capacitor C2:
Phase 1: energy stored in C2
M is open
$V_{C1}=0$ V
no current passes through LR or C1
$V_{C2}=U_0$
In a second phase, energy is transferred to the coil LR:
Phase 2: energy transfer to LR
M is closed
$V_{C1}=U_0$
LR is charged with current
In a third phase, an overvoltage is created:
Phase 3: sudden variation in the current ichargeL passing through LR
M is open
The large variation in current ichargeL due to the sudden opening of M leads to a sudden variation in the magnetic flux generated by the inductor LR and therefore a high induced voltage at the terminals of the receiver coils.

Thus, the locating signal can be a resonant signal damped by causing the circuit LR and C1 to resonate, or making it more characteristic by implementing the sudden variation described above.

It is possible to produce other topologies by modifying the arrangement, and the number of components (LR, C1, C2, M, etc.) and the choice of components (LR with a low series resistance, etc.) in order to optimize the locating signal received by the array of receiver coils.

Generally, one or more receiving antennas can be used in order to locate the on-board modules. These antennas can for example form an array of antennas (by being put side by side) in order to locate the transmitting modules. Each antenna is advantageously a coil, so that an array of receiver coils 4 as shown for example in FIGS. 1 and 2 is obtained.

Topologies other than an array of antennas can be envisioned. The pattern of the arrangement of the antennas is not necessarily regular. Placing the receiving antennas only at certain places where it is desired to detect the position of an on-board module envision can be envisaged for example. The most typical case would be a regular arrangement of the receiving antennas in the form of an array. The array of receiving antennas is not necessarily flat and is not necessarily single. It is possible to envisage q arrays or sub-arrays (q being an integer greater than or equal to 1), placed orthogonally or not placed orthogonally, in order to calculate the position of one or more on-board modules in space (locating in a volume).

In order to simplify the measurement electronics, it is possible to reduce the number of channels (output of the antennas) to be measured. This can be done by wiring the receiving antennas in series or by group of antennas. These antennas in series can then be arranged in rows and columns of antennas so as to be able to determine the position of the on-board modules (see FIG. 13).

Figure 13:
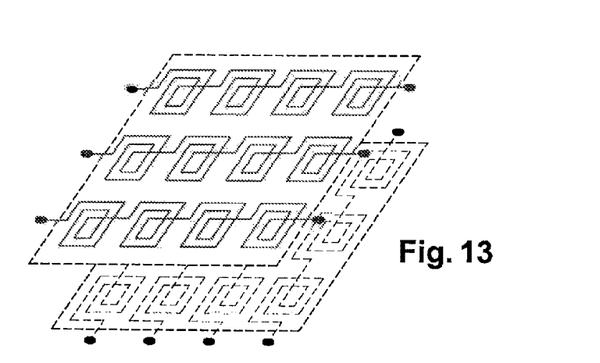
FIG. 13 is a simplified diagrammatic view illustrating the arrangement of coils in rows and columns in an array according to the invention.

The position of the on-board module is then calculated from the levels received on the receiving rows and columns on which the signals are received.

The receiving antennas can be formed on a flexible or rigid printed circuit and can be present on several layers of the printed circuit so as to have more turns for example or a higher density of receiving antennas. The receiving antennas can also be coils of the solenoid type, in order to improve the level of the signals received.

In general, it can be envisioned that the receiving antennas are produced (printing, deposition, etc.) on all types of flexible or rigid, opaque or transparent support. For example, it is possible to place an array of transparent antennas above a surface where it is desired to determine the position of on-board module(s) (glass pane, computer screen, etc.). An array of antennas could for example be made of indium-tin oxide, which is a transparent conductor that is also used for touch screens.

Figure 12:
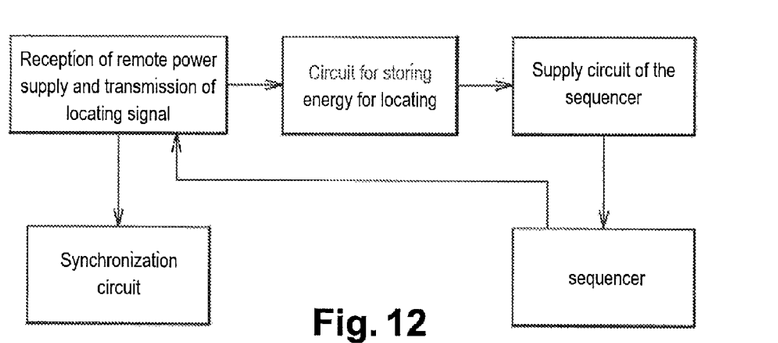
FIG. 12 is a simplified diagrammatic view of an electronic circuit inside an on-board module according to the invention.

FIG. 12 shows an embodiment example of an electronic circuit of an on-board, module. There are five main functions:

Function 1: circuit for reception of the remote power supply and transmission of the locating signal. In the simplest configuration, this stage can consist of a tuned parallel circuit LC that serves firstly for reception of the energy from the remote power supply (conversion of the energy transmitted in the form of a magnetic field into electric current that can be used for supplying the elements of the on-board module) and that serves secondly for transmitting the locating signal (transmission of a magnetic field that will be picked up for locating the on-board module).

Function 2: circuit for storing energy for locating: This stage stores a portion of the energy received from the remote power supply that will serve for creating the locating signal. In the simplest configuration, this stage can consist of a capacitor. During the remote supply phase, this capacitor accumulates energy. The remote power supply phase is followed by a waiting phase, during which the capacitor stores energy. Finally, during the locating phase, the energy accumulated in this capacitor is transmitted to the stage that transmits the locating signal in order to create the locating signal.

Function 3: sequencer supply circuit: this stage stores a portion of the energy received from the remote power supply in order to supply a sequencer F5 of the on-board module. By sequencer is meant the entire circuit used to trigger the locating signal.

Function 4: synchronization circuit: The synchronization circuit makes it possible to detect the start and end of the remote power supply phases so that the module can transmit the locating signal at the desired time, i.e. when the remote power supply phase has ended. (This stage is in particular useful when the TDMA method is used for identifying the on-board modules from one another).

Function 5: sequencer circuit: The sequencer is the whole circuit used to trigger the locating signal. Based on the synchronization signal, the sequencer makes it possible to trigger the transmission of the locating signal at the desired time. When the TDMA method is used for identifying the on-board modules from one another, each on-board module transmits its locating signal at a different time after the remote power supply phase.

For the example in FIG. 13, the receiving antennas are coils etched on a printed circuit and allow an accuracy of 5 mm. This solution has the advantage of being less expensive than the use of "conventional" coils, in addition to being easily implemented. The receiver coils are arranged in rows and columns. Two superposed layers are provided. A first layer on the upper face comprises several rows of flat coils in series. There is also a second layer under the first layer, comprising several rows of flat coils in series. The rows of the first layer are perpendicular to the rows of the second layer, thus constituting an array addressable by rows and columns. The position of an on-board module is indicated by the intersection of a row and a column that have detected the highest level of locating signal.

The ends of the rows comprise connectors for transmitting the signals to the processing unit in the computer 14.

Figure 14:
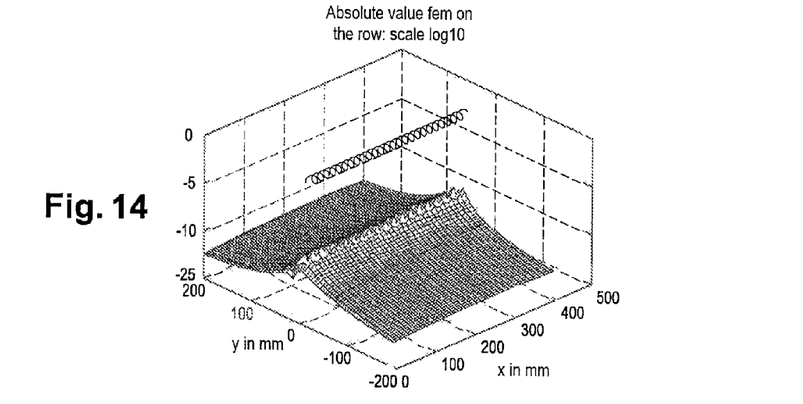
FIG. 14 is a curve obtained by simulation illustrating the (effective) counter-electromotive force produced at the terminals of a row of twenty antennas, at 1 cm from a plane of movement of an transmitting coil.

FIG. 14 shows a simulated curve representing the counter-electromotive force induced (in effective volts) in a row of twenty antennas for a transmitting coil moving on a plane at a height of 1 cm from the receiving row. The transmitting coil is the on-board coil with one turn, an exciting current of 1 mAeff at a frequency of 1 kHz, and a diameter of 1 cm.

Examples of functional modes of the device according to the invention will now be described.

The general principle consists of locating one or more elements (on-board modules) moving with respect to an array of receiver coils or vice versa.

The locating device according to the invention is constituted by:
- various transmitting modules (=on-board modules): S1, S2, S3, . . . , Sn (n being an integer greater than or equal to 1)
- an array comprising 1 to p antennas (p being an integer greater than or equal to 1)
- a power supply module of the transmitting modules, which can be:

a remote power supply of the transmitting modules to be located (remote power supply)

an on-board power supply in the transmitting modules to be located (for example a battery)

Figure 15:
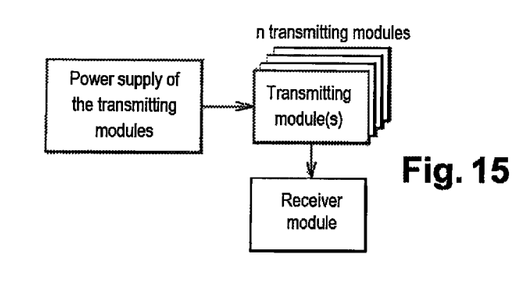
FIG. 15 is a diagrammatic view illustrating the principle of operation of the device according to the invention.

FIG. 15 shows the basic principle of the method utilized in the present invention. The n transmitting modules are supplied, and in turn they transmit a locating signal to the receiving module (the array of receiver coils).

Figure 16:
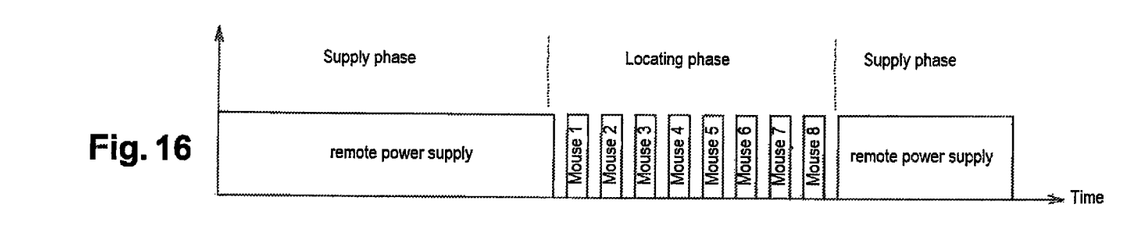
FIG. 16 is a diagrammatic view illustrating a method of identification by multiplexing with time-distributed multiple access (TDMA)

FIG. 16 shows a first embodiment of the method according to the invention. After a power supply phase, each module waits a given length of time before transmitting its locating signal. The transmitting modules therefore transmit responses which are time-separated. It can be envisioned in this case that the locating signals have the same spectrum whether they are periodical or pseudoperiodical signals. In other words, identification of the TDMA ("Time Division Multiple Access") type is applied: each module transmits its locating signal in the time that is allotted to it. Thus, if the cage contains 8 mice, 8 responses are received one after another. Knowing the response delay associated with each on-board module, it is possible to identify the on-board module (time slot method).

Figure 17:
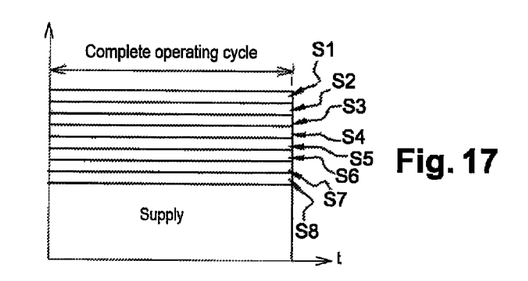
FIG. 17 is a diagrammatic view illustrating a method of identification by multiplexing with frequency-distributed multiple access (FDMA).

FIG. 17 shows a second embodiment of the method according to the invention. In this embodiment, the power supply phase can be superimposed on the locating phase. Identification of the FDMA ("Frequency Division Multiple Access") type is applied in this case: all the on-board modules transmit their locating signals at the same time but at different frequencies. Knowing the frequency associated with each transmitting module (on-board module), it is possible to identify each on-board module independently. This is a frequency slot method. The operating cycle can be very short, but this requires considerable resources at the level of the processing unit for discriminating the different frequencies.

In addition to the foregoing, an identifier can be associated with each on-board module. In order to be identified, each mouse sends a unique code. To this end, the above two methods can be used. However, in contrast to the preceding two solutions, the signals sent comprise additional identification information (unique code of each mouse).

The invention can therefore be utilized for example for locating rodents, locating human fingers (glove comprising several transmitting modules, one in each finger), locating objects with respect to a surface (pieces for a board game, etc.), locating objects on a graphics tablet (for example with an transmitting module at the end of the stylus), etc.

Of course, the invention is not limited to the examples which have just been described and numerous adjustments can be made to these examples without exceeding the scope of the invention.

The invention claimed is:

1. A method. for locating at least one mobile element in a predetermined zone, the method comprising the following steps:

supplying power to at least one on-board module in the mobile element, said at least one on-board module comprising an electronic circuit and at least one on-board coil;

generating a locating signal by the electronic circuit and transmission of said locating signal via said at least one on-board coil;

picking up said locating signal by receiver coils distributed on a support in proximity to the predetermined zone, each of said receiver coils having the function of picking up said locating signal when the mobile element is in proximity: and determining a location of the mobile element in the predetermined zone by detecting a signal level on said support which is addressed in rows and columns in the form of an array by a processing unit connected to said support, wherein said electronic circuit and said at least one on-hoard coil constitute an RLC ("Resistor-Inductor-Capacitor") circuit that oscillates, generating the locating signal by sudden interruption of the current through said at least one on-board coil.

2. The method according to claim 1, wherein supplying power to said at least one on-board module is carried out periodically; in a supply phase, wherein energy is stored in each of said at least one on-board module for later use in a non-supply phase.

3. The method according to claim 1, wherein generating the locating signal is carried out at a different time for each of said at least one on-board module so as to carry out multiplexing with time-distributed multiple access (TDMA) to distinguish the on-board modules from one another.

4. The method according to claim 1, wherein generating the locating signal is carried out by generating a signal of a predetermined frequency that is different for each of said at least one on-board module so as to carry out multiplexing with frequency-distributed multiple access (FDMA) to distinguish the on-board modules from one another.

5. The method according to claim 1, wherein each locating signal contains a unique identifier.

6. The method according to claim 1, wherein the sudden interruption is carried out when the current is at its highest value.

7. A device for locating at least one mobile element in a predetermined zone, the device comprising:

at least one on-board module in the at least one mobile element, said at least one on-board module comprising an electronic circuit and at least one on-board coil for transmitting a locating signal;

a power supply for said at least one on-board module;

receiver coils distributed on a. support in proximity to the predetermined zone;

each of said receiver coils having the function of detecting said locating signal when the at least one mobile element is in proximity;

a processing unit connected to the receiver coils for determining a location of the at least one mobile element in the predetermined zone by detecting a signal level on said support that is addressed in rows and columns in the form of an array; and the electronic circuit and the on-board coil constitute an oscillating RLC ("Resistor-Inductor-Capacitor") circuit, the electronic, circuit being configured to suddenly interrupt the current through the at least one on-board coil to generate the locating signal.

8. The device according to claim 7, wherein the power supply comprises a magnetic winding arranged in proximity to the predetermined zone to supply each of said at least one on-board module remotely, by a magnetic field.

9. The device according to claim 7, wherein the power supply consists of an array to supply each said at least one on-board module remotely, by a magnetic field.

10. The device according to claim 8, wherein the at least one on-board module comprises a supply coil having the function of picking up the remote power supply magnetic field.

11. The device according to claim 10, wherein the at least one on-board coil and the power supply coil constitute are the same coil.

12. The device according to claim 7, wherein the at least one on-board module comprises at least three on-board coils in a trihedral arrangement.

13. The device according to claim 7, wherein each said at least one on-board coil comprises a ferrite core.

14. The device according to claim 13, wherein the ferrite core comprises hemispherical ends.

\* \* \* \* \*